United States Patent [19]

Kawahira et al.

[11] Patent Number: 5,202,204

[45] Date of Patent: Apr. 13, 1993

[54] PROCESS OF PRODUCING EXPOSURE MASK

[75] Inventors: Hiroichi Kawahira; Takehiko Gunji; Satoru Nozawa, all of Kanagawa, Japan

[73] Assignee: Sony Corporation, Tokyo, Japan

[21] Appl. No.: 536,303

[22] Filed: Jun. 11, 1990

[30] Foreign Application Priority Data

Jun. 13, 1989 [JP] Japan .................................. 1-150289

[51] Int. Cl.$^5$ ................................................. G03F 9/00
[52] U.S. Cl. .......................................... 430/5; 430/22; 430/30; 430/296; 430/494; 430/942; 378/35; 250/492.2; 250/492.3
[58] Field of Search ................ 430/5, 22, 30, 296, 430/494, 942; 378/35; 250/492.2, 492.3

[56] References Cited

U.S. PATENT DOCUMENTS

| | | | |
|---|---|---|---|
| 4,377,627 | 3/1983 | Vinton | 430/22 |
| 4,621,371 | 11/1986 | Gotou et al. | 378/34 |
| 4,887,283 | 12/1989 | Hosono | 430/5 |
| 5,083,032 | 1/1992 | Suzuki | 250/492.2 |

FOREIGN PATENT DOCUMENTS

| | | | |
|---|---|---|---|
| 0121412 | 10/1984 | European Pat. Off. | 378/34 |
| 2066487 | 7/1981 | United Kingdom | 430/22 |

*Primary Examiner*—Charles L. Bowers, Jr.
*Assistant Examiner*—Thomas R. Neville
*Attorney, Agent, or Firm*—Hill, Steadman & Simpson

[57] ABSTRACT

A process of producing an exposure mask by which the accuracy of a pattern of a mask film to be formed on a surface of a transparent substrate is improved and also the accuracy in registration between layers is improved. The process comprises the step of correcting, upon exposure for the formation of a mask pattern, the position of a mask pattern by a different correction amount in accordance with a ratio at which the area of the mask film which remains after etching occupies in the entire area of a transparent substrate on which the mask film is formed.

5 Claims, 3 Drawing Sheets

PROCESS OF PRODUCING EXPOSURE MASK

BACKGROUND OF THE INVENTION

1. Field of the Invention

This invention relates to a process of producing an exposure mask, and more particularly to a process of producing an exposure mask wherein exposure processing and selective etching processing are performed for a mask film formed on a transparent substrate to form a mask pattern of the mask film.

2. Description of the Related Art

When semiconductor integrated circuits such as ICs, LSIs or VLSIs are to be produced, it is necessary to form various patterns on semiconductor substrates. Formation of the patterns is performed in accordance with an optical transfer method using a mask wherein a mask film is selectively formed on a transparent substrate that has been prepared in advance and then light, an ion beam, an electron beam or the like is projected onto a semiconductor substrate via the mask, as disclosed, for example, in Japanese Patent Laid-Open No. 59-178726.

More particularly, a photo-resist film of the negative type or of the positive type is first applied to a surface of a semiconductor substrate, and then, light, an ion beam, an electron beam or the like is projected onto the photo-resist film through the exposure mask. Then, where the photo-resist film is of the negative type, a portion of the photo-resist film which is irradiated with light cures, but alternatively where the photo-resist film is of the positive type, a portion of the photo-resist film which is irradiated with light becomes dissolvable. Afterwards, developing processing is performed. Consequently, where the photo-resist film is of the negative type, a remaining portion of the photoresist film other than the portion which has been irradiated to cure with light is removed, but alternatively where the photo-resist film is of the positive type, the portion of the photo-resist film which has been irradiated with light is removed while the other portion which has not been irradiated with light remains as it is. After such development, a predetermined pattern is formed on the semiconductor substrate by etching of a ground film and so forth using the photo-resist film as a mask. Further, introduction of impurities may sometimes be performed using the photo-resist film as a mask.

By the way, formation of a pattern on a semiconductor substrate is performed several times, and during such pattern formation, a photo-resist film of the negative type may be used or a photo-resist film of the positive type may be used, but all of the patterns are not formed using only one of the two types of photo-resist film. This is because, where the ratio of the area to be etched to the entire area of the semiconductor substrate is very low such as when a through-hole is formed in an insulator film, fine formation can be performed comparatively readily if a photo-resist film of the positive type is used, but on the other hand where the ratio of the area to be etched to the entire area of the semiconductor substrate is comparatively high, it is preferable to use a photo-resist film of the negative type. Besides, during the process of producing a semiconductor device, it is necessary to form a pattern wherein a portion to be etched is greater in area than the other portion which is not to be etched, and also it is necessary to form another pattern wherein the relationship is reversed.

FIG. 2(A) shows a negative reticule which is applied as an exposure mask for use in etching using a photo-resist film of the positive type, and FIG. 2(B) shows a positive reticule which is applied as an exposure mask for use in etching using a photo-resist film of the negative type.

Referring to FIGS. 2(A) and 2(B), the positive and negative reticules shown include each a transparent substrate a made of glass, and a mask film b formed on one of two opposite main surfaces of the transparent substrate a and commonly made of chrome. The negative reticule shown in FIG. 2(A) is normally produced in the following manner. First, a mask film b of chrome or the like is formed on an entire main surface of the transparent substrate a, and then a photo-resist film of the positive type is formed on the mask film b and then exposed to light using an electron beam exposing device. Then, the photo-resist film of the positive type is developed, whereafter the mask film b is etched using the photo-resist film of the positive type as a mask. In this instance, the ratio of the area of the remaining mask film b to the area of the entire reticule is considerably higher than 50%. On the other hand, the positive reticule shown in FIG. 2(B) is produced using a photo-resist film of the negative type as a resist film and is different in that the ratio of the area of the mask film b remaining on the transparent substrate 1 after selective etching to the entire area of the reticule is considerably lower than 50%. Conventionally, however, such positive reticule as well as the negative reticule are produced by the same process.

By the way, as higher density integration of semiconductor devices proceeds, it becomes progressively more important to raise the accuracy in registration of layers formed by chip pattern transfer. Therefore, it is required to improve the accuracy in registration between individual reticules used for the production of a device. However, actually it is difficult to satisfy such requirement.

Thus, an investigation of the cause of such registration inaccuracies has been conducted. From the investigation, it has become apparent that the accuracy in position is different between a reticule wherein the ratio of the area occupied by the mask film b to the entire area of the reticule is comparatively high as in the case of the reticule shown in FIG. 2(A) and another reticule wherein the ratio of the area occupied by the mask film b to the entire area of the reticule is comparatively low as shown in FIG. 2(B), and as a result, an error in registration occurs between a layer, a film, a through-hole or the like formed using such a negative reticule as shown in FIG. 2(A) and a layer, a film, a through-hole or the like formed using such a positive reticule as shown in FIG. 2(B). These registration errors are a significant obstruction to further higher integration of semiconductor devices. Further, it has become apparent that the difference in accuracy in position between a positive reticule and a negative reticule arises from the fact that they are subject to differences in the degree to which they are warped by thermal stress. This will be described more in detail below with reference to FIGS. 3 and 4.

At a stage before a mask pattern is formed but after a mask film b made of chrome has been formed, for example, by vapor deposition on an entire surface of a transparent substrate a made of glass, the exposure mask has some degree of warp arising from thermal stress as shown at c in FIG. 3, wherein such warp is shown in a somewhat exaggerated manner. Photo etching is then performed for the mask film b of the exposure mask c to form a negative reticule such as, for example, shown at d in FIG. 3 or a positive reticule such as shown at e in FIG. 3. In this instance, since the area of the mask film b is reduced upon such photo etching, also the degree of warp by thermal stress is reduced. However, the degree of reduction of such warp by thermal stress is different between the positive reticule and the negative reticule, and the degree of reduction of the warp of the positive reticule wherein the area of the mask film b is comparatively small is greater than that of the negative reticule wherein the relationship is reverse. As a result, the degree of displacement in position coordinates which is caused by reduction of the warp is smaller with the negative reticule than with the positive reticule as seen from FIGS. 4(A) and 4(B). In particular referring to FIGS. 4(A) and 4(B), solid lines indicate ideal gratings while broken lines indicate actual gratings after etching, and a displacement between the gratings is a displacement of coordinates caused by warp. Then, if articles having substantially the same ratios of the area of the mask film b to the entire area of the reticule can be used at all of the steps, then the tolerance in registration of layers described above can be reduced to a very small value. Actually, however, it is impossible to form all mask patterns using reticules having ratios of a substantially same level of the mask film b area to the entire area of the reticule, and consequently, it cannot be avoided that the ratio of the mask film b area to the entire area of the reticule is different for each mask pattern forming step. Accordingly, there is a great limitation to improving the layer registration accuracy using conventional techniques.

SUMMARY OF THE INVENTION

It is an object of the present invention to provide a process of producing an exposure mask by which the accuracy of a pattern of a mask film to be formed on a surface of a transparent substrate is improved and also the accuracy in registration between layers is improved.

In order to attain the object, according to an aspect of the present invention, there is provided a process of producing an exposure mask wherein a mask film is formed on a transparent substrate, and then, exposure processing and selective etching processing are performed for the mask film to form a mask pattern of the mask film, which comprises the step of correcting, upon exposure for the formation of a mask pattern, the position of the mask pattern by a different correction amount in accordance with a ratio of the area of the mask film which remains after etching to the area of the transparent substrate. Preferably, a plurality of correction amounts are obtained in advance for each of a plurality of different types of mask films, the amount of correction of the position of a mask pattern is selected from among such correction amounts in accordance with the type of mask film involved. The amount of the correction of the position of a mask film may include expansion errors in particular perpendicular directions and an error in orthogonality.

With the process, since the position of a mask pattern is corrected by a different correction amount in accordance with a ratio of the mask film area to the area of a transparent substrate, a difference between coordinates of positions on the mask which may arise from a difference between ratios of the mask film area to the area of the transparent substrate can be eliminated. Consequently, the accuracy of a pattern of the mask film is improved. Then, the layer registration accuracy during the production of semiconductor devices can be improved.

The above and other objects, features and advantages of the present invention will become apparent from the following description and the appended claims, taken in conjunction with the accompanying drawings in which like parts are denoted by like reference characters all through the drawings.

DETAILED DESCRIPTION OF THE PREFERRED EMBODIMENT

Figure 1:
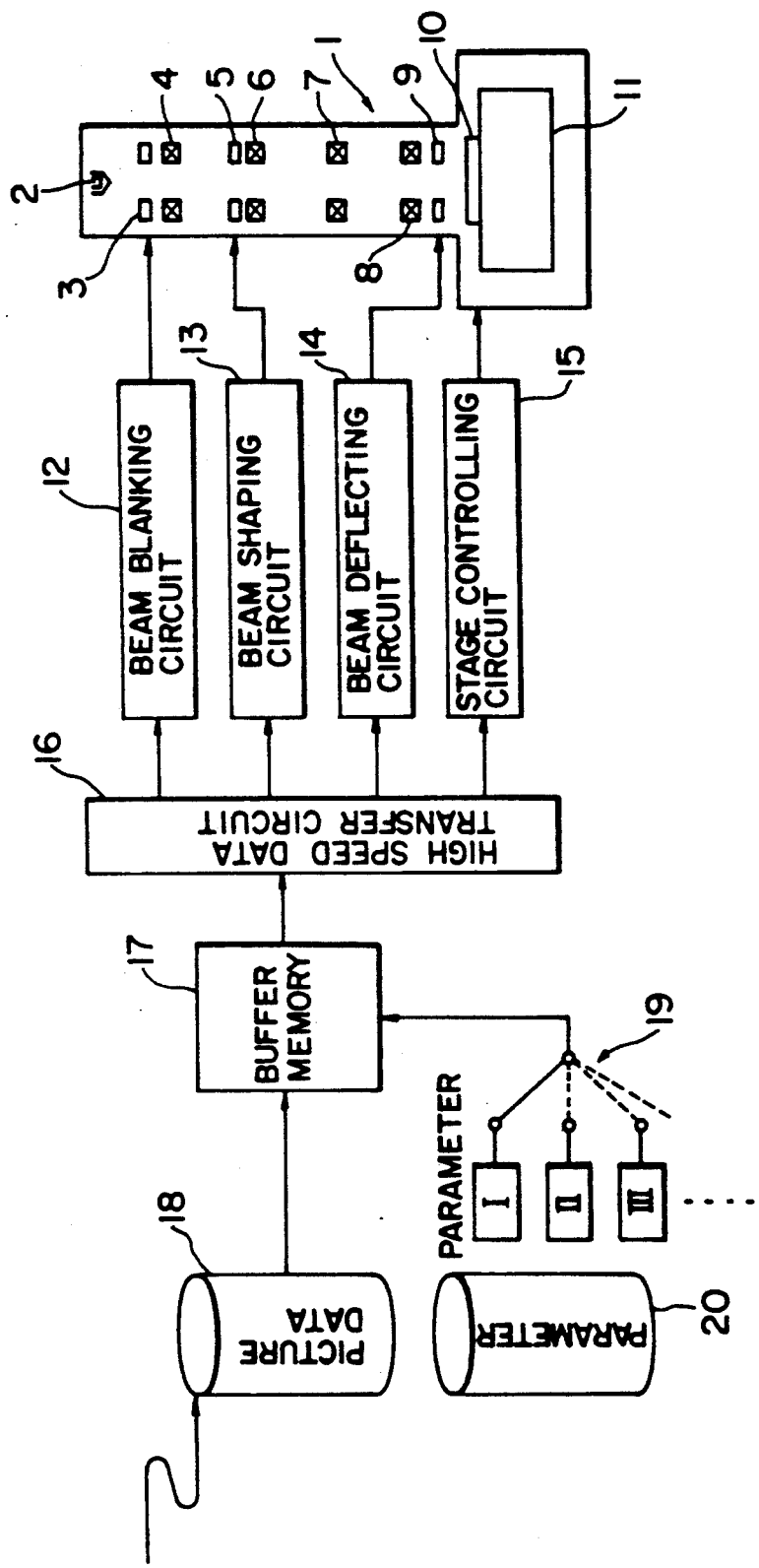
FIG. 1 is a schematic diagram of an electron beam exposing device for use with a process of producing an exposure mask according to the present invention.
Figure 2A:
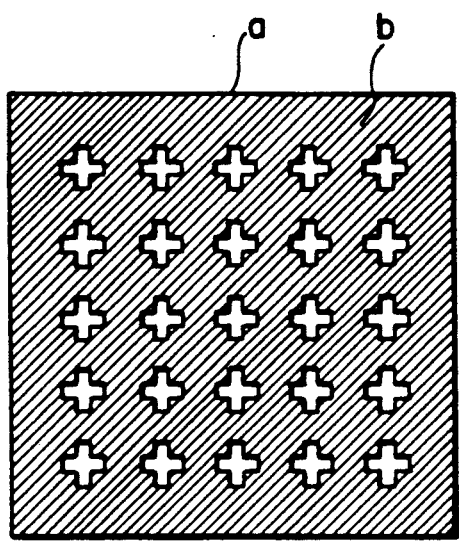
FIGS. 2(A) and 2(B) are plan views of exposure masks or reticules of the negative type and the positive type, respectively.
Figure 2B:
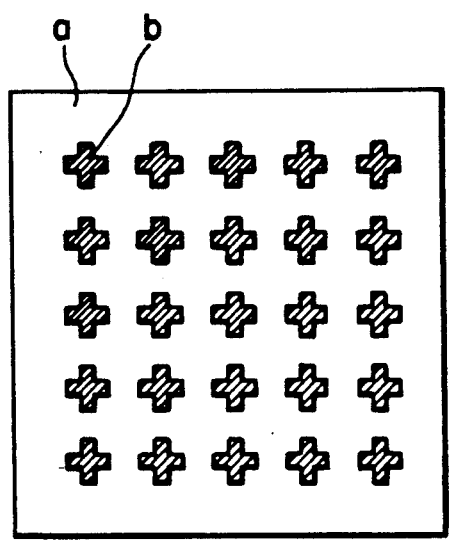
Figure 3:
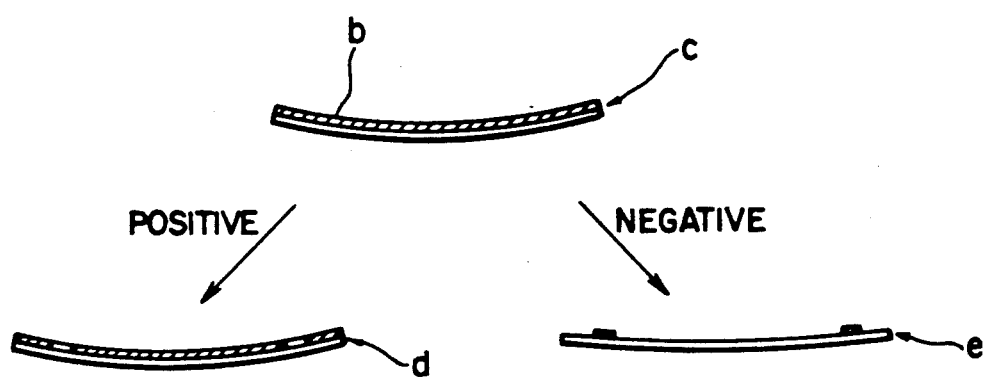
FIG. 3 is a sectional view illustrating warps of exposure masks of the different types by photo etching.
Figure 4A:
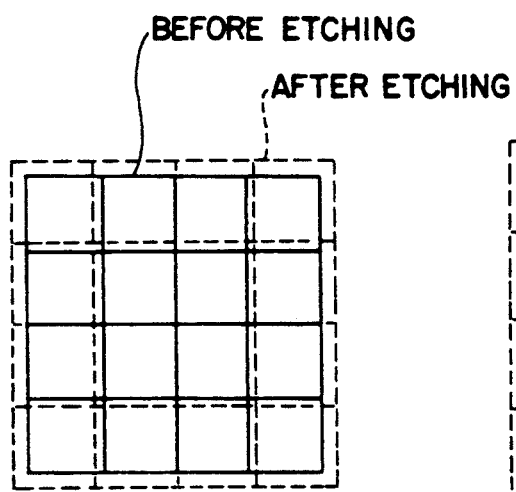
FIGS. 4(A) and 4(B) are diagrammatic representations illustrating different displacements in positional coordinates between exposure masks of the negative type and the positive type, respectively.
Figure 4B:
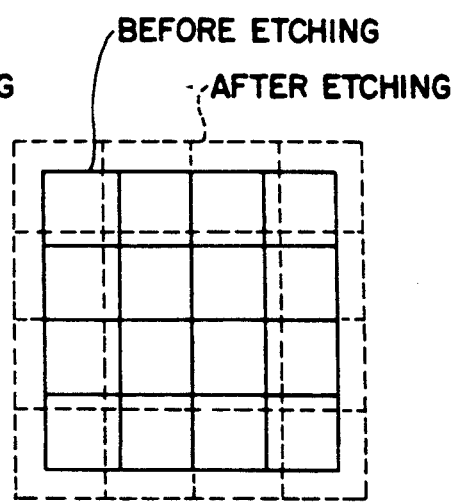

Referring to FIG. 1, there is shown an electron beam exposing device for use in exposure for the formation of a mask pattern. The electron beam exposing device shown includes a device body 1, an electron gun 2, a blanking electrode 3, a lens 4, a beam shaping electrode 5, several lenses 6 to 8, a deflecting electrode 9, and a reticule supporting table 11 for supporting thereon a reticule 10 to be exposed to an electron beam.

The electron beam exposing device further includes a beam blanking circuit 12 for performing blanking control to blank or not to blank the electron beam, a beam shaping circuit 13 for shaping a sectional shape of the beam into a predetermined shape, a beam deflecting circuit 14 for deflecting the beam, a stage controlling circuit 15, a high speed data transfer circuit 16, a buffer memory 17, and a switch 19 for causing correction of position coordinates to be performed correctly in accordance with a drawing picture ratio of a reticule (that is, a ratio of the area of a mask film to the entire area of a reticule after etching) on which a mask pattern is to be formed by exposure to light. Thus, data wherein a drawing picture ratio is employed as a parameter can be inputted in a changed over condition to the buffer memory 17. It is to be noted that the individual circuits described above are all controlled by a CPU (central processing unit) not shown.

In operation, after input of drawing picture data 18 in accordance with which a mask pattern to be formed is to be drawn, the electron beam exposing device corrects the drawing picture data 18 for a displacement of position coordinates which is caused by such warp of the exposure mask as described above, and then the electron beam exposing device draws a picture with an electron beam in accordance with the corrected drawing picture data. Then, the correction proceeds such that a correct correction amount is always assured by changing over the switch 19 in accordance with a drawing picture ratio of a reticule.

Data 20 for such correction are prepared in the following manner in advance.

First, an expansion error Xg in an X direction, another expansion error Yg in a perpendicular Y direction and an error Og in orthogonality of a mask pattern when an exposure mask is formed after exposure without correction are measured. Such measurement is made for each of a reticule having a drawing picture ratio higher than 50% (a positive reticule) and another reticule having a drawing picture ratio lower than 50% (a negative reticule). Here, an expansion error in the X direction with regard to a positive reticule is represented by Xgp, an expansion error in the Y direction by Ygp and an error in orthogonality by Ogp, while an expansion error in the X direction with regard to a negative reticule is represented by Xgn, an expansion error in the Y direction by Ygn, and an error in orthogonality by Ogn.

Then, if a reticule on which a mask pattern is to be formed is a positive reticule, then the switch 19 is changed over to the positive reticule side so that data for which correction has been made by −Xgp for the X direction, by −Ygp for the Y direction and by −Ogp for the orthogonality may be read out from the buffer memory 17. Consequently, even if the exposure mask has such a warp as described hereinabove, no error in position coordinates of the mask pattern takes place.

On the other hand, in the case of a negative reticule, even if the switch 19 is changed over to the negative reticule side, data for which the correction has been made by −Xgn for the X direction, by −Ygn for the Y direction and by −Ogn for the orthogonality are read out from the buffer memory 17. Consequently, also in this instance, no error of position coordinates of a mask pattern takes place.

Thus, if the switch 19 is changed over in accordance with a drawing picture ratio to correct position coordinates corresponding to the drawing picture ratio for all of the reticules necessary for the production of a semiconductor device using the device shown in FIG. 1 and then an exposing operation is performed, then the accuracy in registration of layers can be raised very much, and it is possible to cope with a rule of 0.35 μm or even a finer rule and also to produce 16 Megabyte static RAMs and 64 Megabyte static RAMs.

It is to be noted that changing over in accordance with a drawing picture ratio is performed between two stages in the embodiment described above. However, in order to perform such correction more accurately, the drawing picture ratio should be changed over among more stages, and the example described hereinabove is a mere illustrative embodiment of the present invention from which all and various variations can be made in accordance with the present invention.

Having now fully described the invention, it will be apparent to one of ordinary skill in the art that many changes and modifications can be made thereto without departing from the spirit and scope of the invention as set forth herein.

We claim:

1. A process of producing an exposure mask wherein a mask film is formed on a transparent substrate, and then, exposure processing and selective etching processing are performed for the mask film to form a mask pattern of the mask film, comprising the steps of:

determining a ratio of an area of mask film which is to remain after etching to a total area of a mask substrate; and correcting, during exposure for formation of the mask pattern, a position of the mask pattern by a correction amount that depends on the ratio determined in the preceeding step.

2. A process according to claim 1, further comprising the steps of:

obtaining in advance of said correcting step a plurality correction amounts for each of a plurality of different types of mask films, and selecting an amount of correction of the position of a mask pattern from among said plurality of correction amounts depending on which of said plurality of different types of mask films is to be used.

3. A process according to claim 1, wherein the amount of the correction of the position of a mask film includes expansion errors in particular perpendicular directions and an error in orthogonality.

4. A device for the exposure of a transparent substrate having a mask film formed thereon, comprising:

means for supporting thereon a transparent substrate on which a type of mask film is formed, an electron gun, storage means for storing therein data for the formation of a mask pattern of the mask film on the transparent substrate;

means for controlling an electron beam emitted from said electron gun in accordance with data received from said storage means, and means for correcting the data stored in said storage means by an amount depending on said type of said mask film in accordance with a ratio of the area of the mask film of said type which remains after etching to the entire area of transparent substrate.

5. A device according to claim 4, further comprising: a switch means, and wherein said storage means has a plurality of correction amounts stored therein individually for a plurality of different types of mask films, and one of the correction amounts is selected in response to an output of said switch means.

* * * * *